United States Patent
Fukushima et al.

(10) Patent No.: US 12,396,197 B2
(45) Date of Patent: Aug. 19, 2025

(54) SEMICONDUCTOR DEVICE

(71) Applicants: SONY GROUP CORPORATION, Tokyo (JP); SONY SEMICONDUCTOR SOLUTIONS CORPORATION, Kanagawa (JP)

(72) Inventors: Sei Fukushima, Tokyo (JP); Yuya Kanitani, Tokyo (JP); Masashi Yanagita, Kanagawa (JP)

(73) Assignees: SONY SEMICONDUCTOR SOLUTIONS CORPORATION, Kanagawa (JP); SONY GROUP CORPORATION, Tokyo (JP)

( * ) Notice: Subject to any disclaimer, the term of this patent is extended or adjusted under 35 U.S.C. 154(b) by 456 days.

(21) Appl. No.: 17/925,987

(22) PCT Filed: Apr. 16, 2021

(86) PCT No.: PCT/JP2021/015666
§ 371 (c)(1),
(2) Date: Nov. 17, 2022

(87) PCT Pub. No.: WO2021/241059
PCT Pub. Date: Dec. 2, 2021

(65) Prior Publication Data
US 2023/0207678 A1 Jun. 29, 2023

(30) Foreign Application Priority Data
May 29, 2020 (JP) .................................. 2020-095054

(51) Int. Cl.
*H10D 30/47* (2025.01)
*H10D 62/85* (2025.01)
*H10D 64/23* (2025.01)

(52) U.S. Cl.
CPC ....... *H10D 30/475* (2025.01); *H10D 62/8503* (2025.01); *H10D 64/251* (2025.01)

(58) Field of Classification Search
None
See application file for complete search history.

(56) References Cited

U.S. PATENT DOCUMENTS

2023/0207678 A1* 6/2023 Fukushima ......... H01L 21/0254
257/183

FOREIGN PATENT DOCUMENTS

| JP | 2004-111910 A | 4/2004 |
| JP | 2005-217364 A | 8/2005 |

(Continued)

OTHER PUBLICATIONS

International Search Report and Written Opinion of PCT Application No. PCT/JP2021/015666, issued on Jul. 13, 2021, 11 pages of ISRWO.

*Primary Examiner* — Jack S Chen
(74) *Attorney, Agent, or Firm* — CHIP LAW GROUP

(57) ABSTRACT

A semiconductor device includes a barrier layer, a channel layer, a regrowth layer, a vacancy generation region, and a source electrode or a drain electrode. The barrier layer includes a first nitride semiconductor. The channel layer includes a second nitride semiconductor and is bonded to the barrier layer at a first surface. The regrowth layer includes an n-type nitride semiconductor and is provided in a region dug deeper than an interface between the barrier layer and the channel layer from a second surface of the barrier layer. The second surface is on opposite side to the first surface. The vacancy generation region includes a nitrogen-capturing element and is provided in a region of the regrowth layer shallower than the interface between the barrier layer and (Continued)

the channel layer. The source electrode or the drain electrode is provided on the regrowth layer.

10 Claims, 10 Drawing Sheets

(56) References Cited

FOREIGN PATENT DOCUMENTS

| JP | 2012-227456 A | 11/2012 |
| JP | 2013-149732 A | 8/2013 |
| JP | 2014-072258 A | 4/2014 |
| JP | 2014-154685 A | 8/2014 |
| JP | 2019-192698 A | 10/2019 |

* cited by examiner

[FIG. 1]
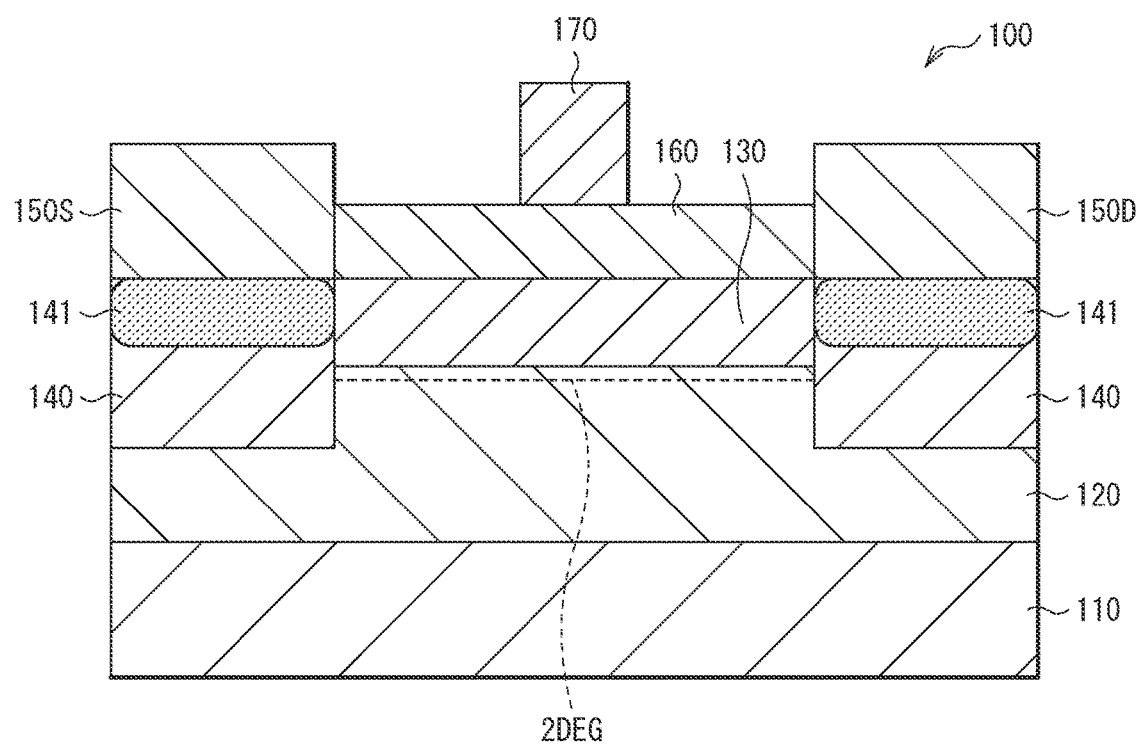

[FIG. 2]
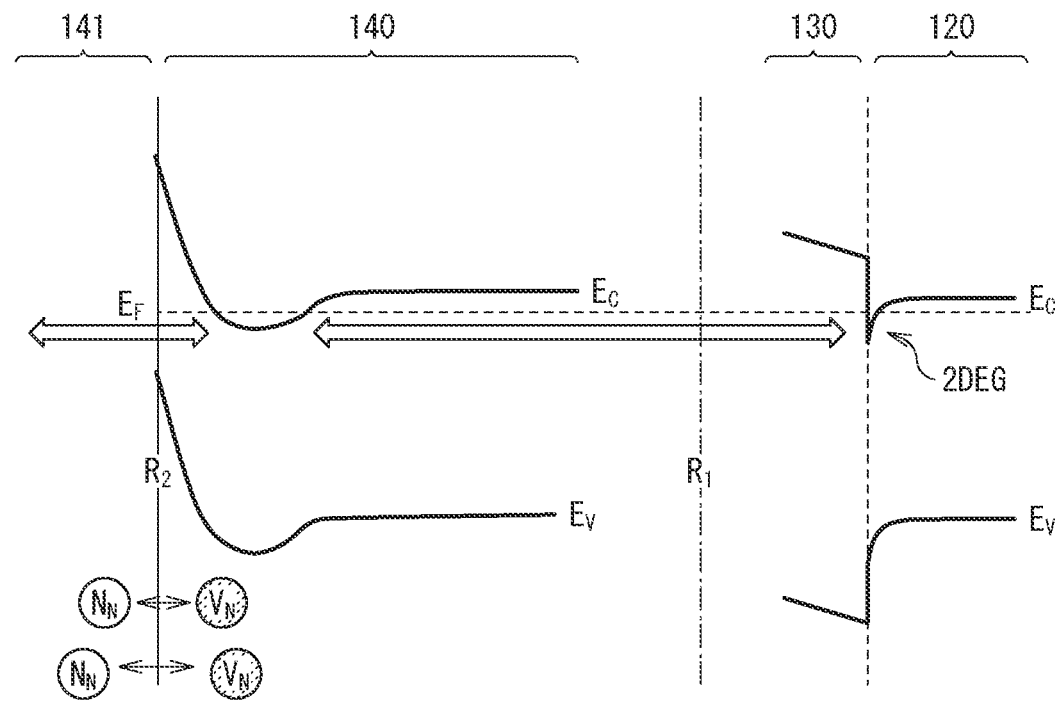
[FIG. 3]
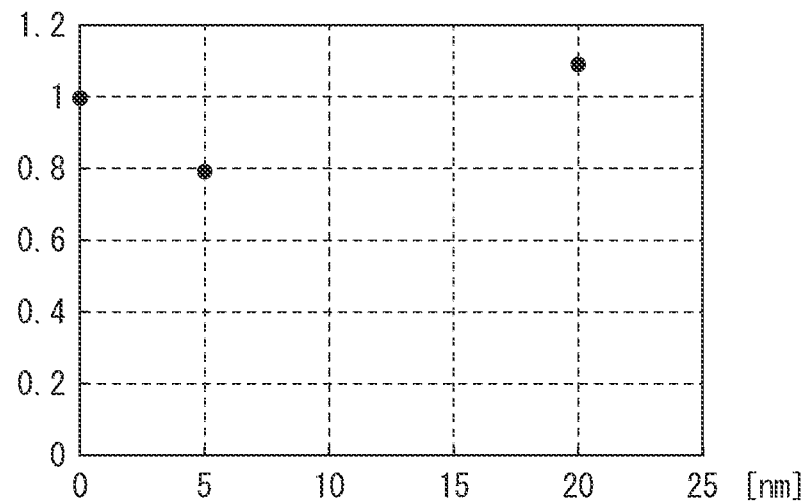

[FIG. 4A]
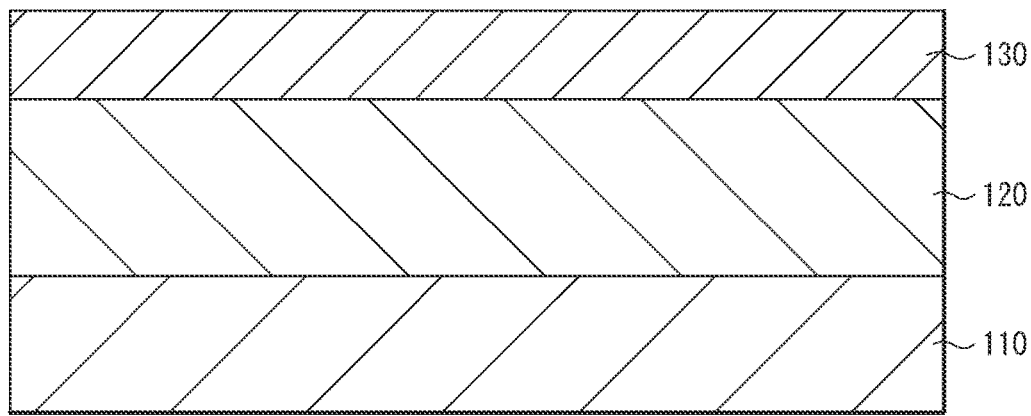
[FIG. 4B]
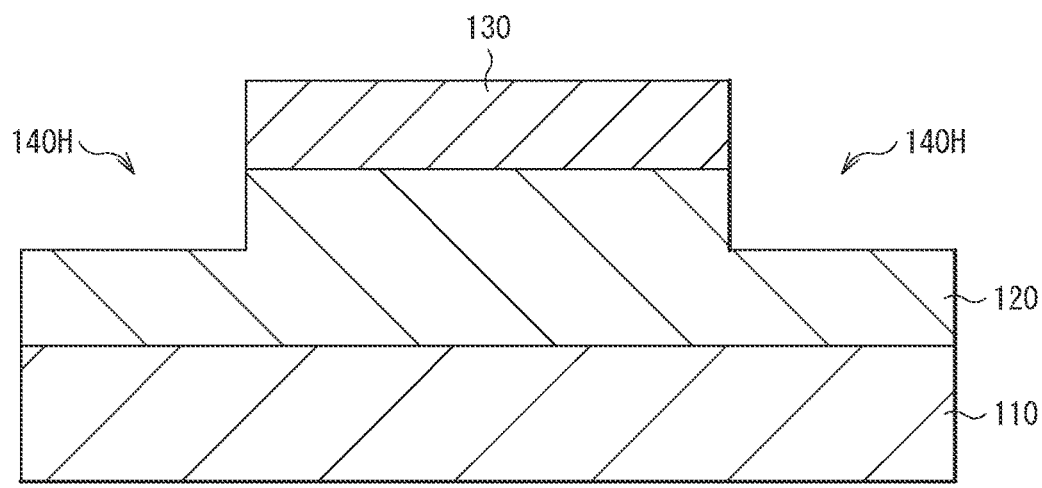

[FIG. 4C]
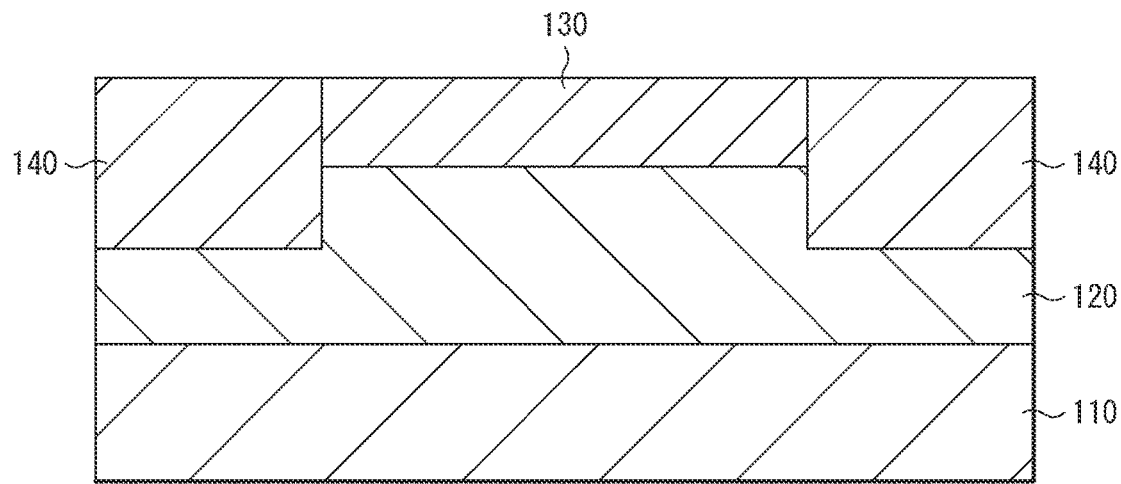
[FIG. 4D]
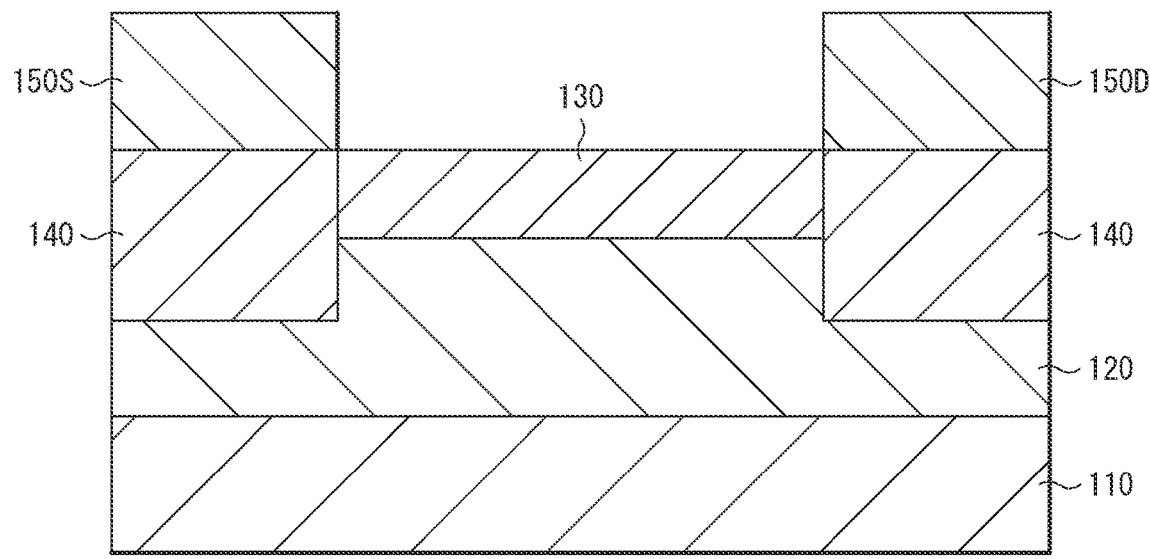

[FIG. 4E]
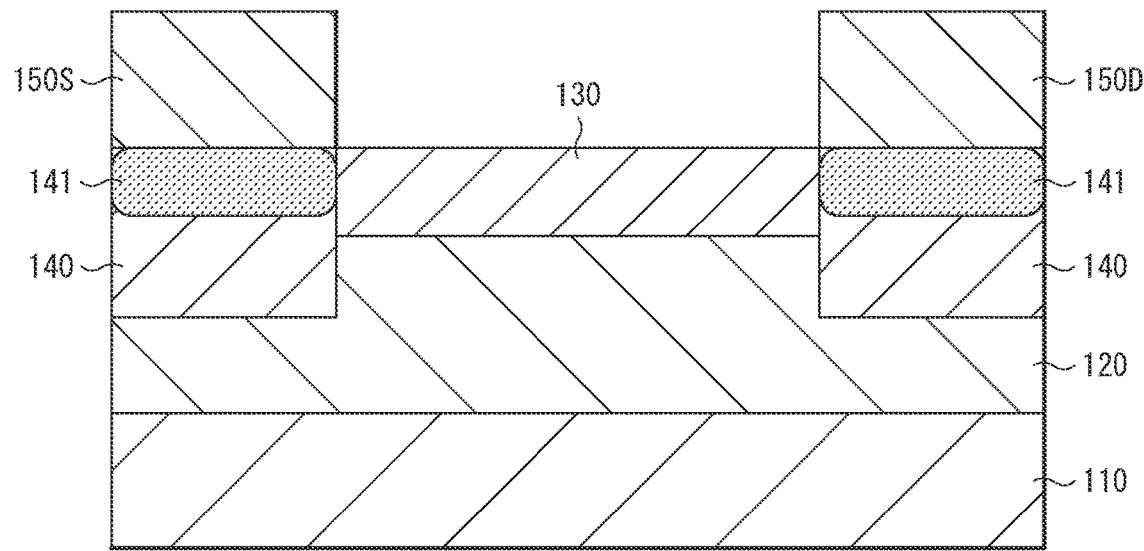
[FIG. 4F]
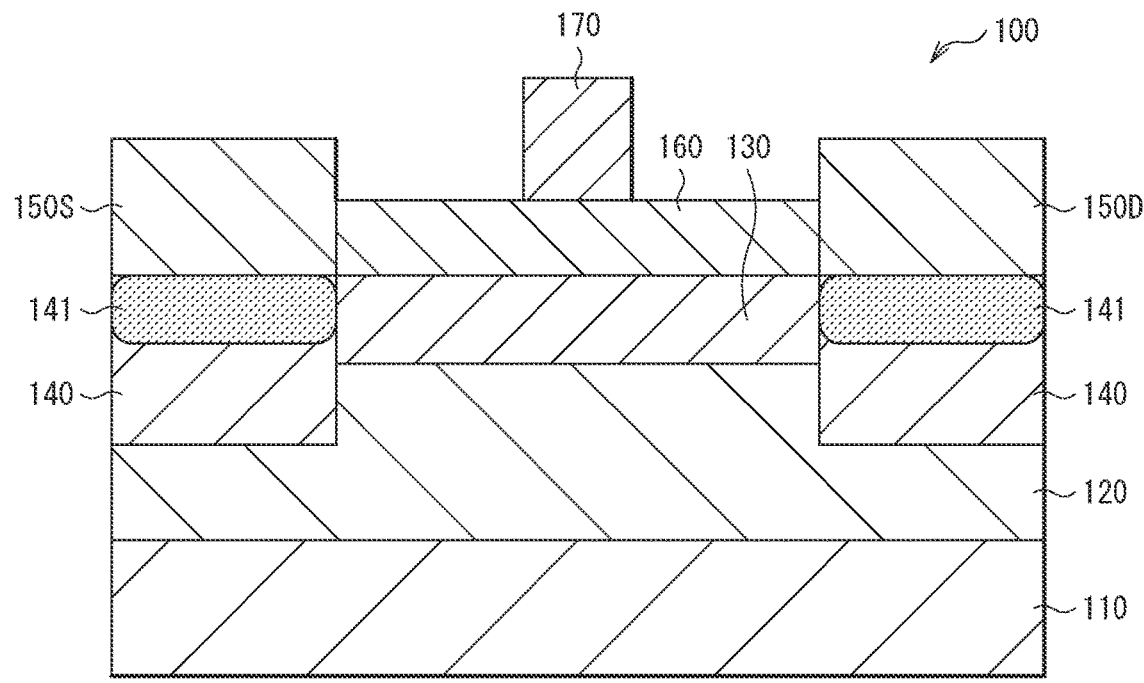

[FIG. 5]
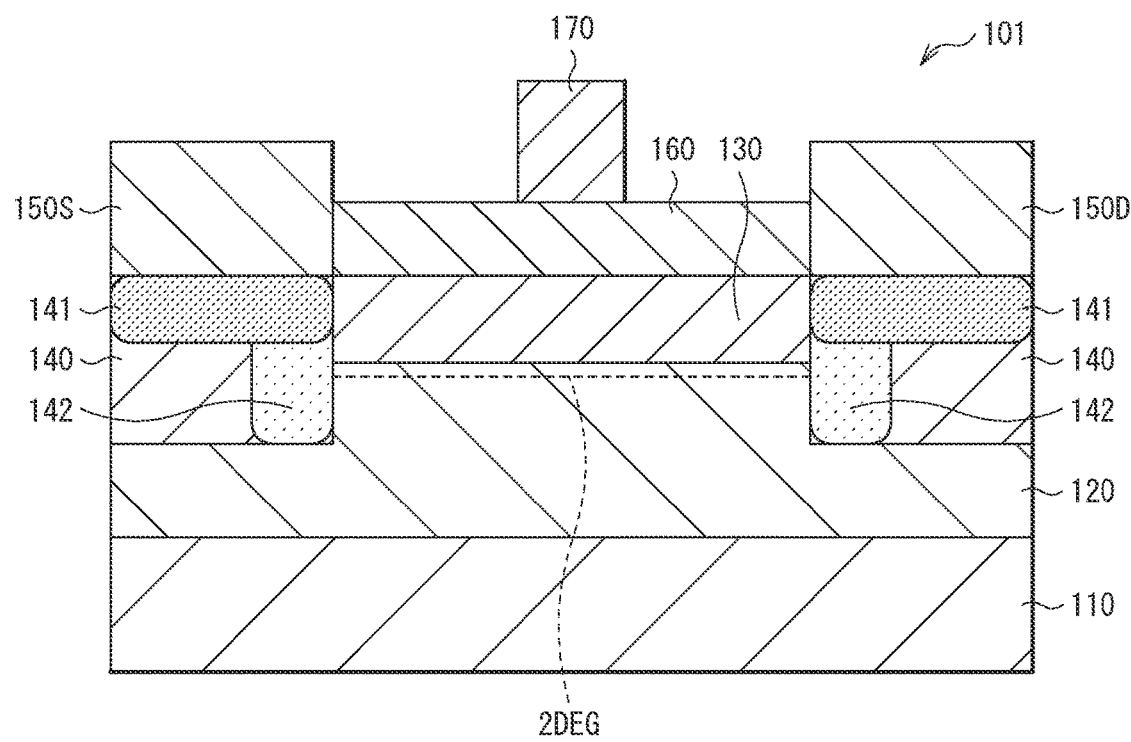

[FIG. 6]
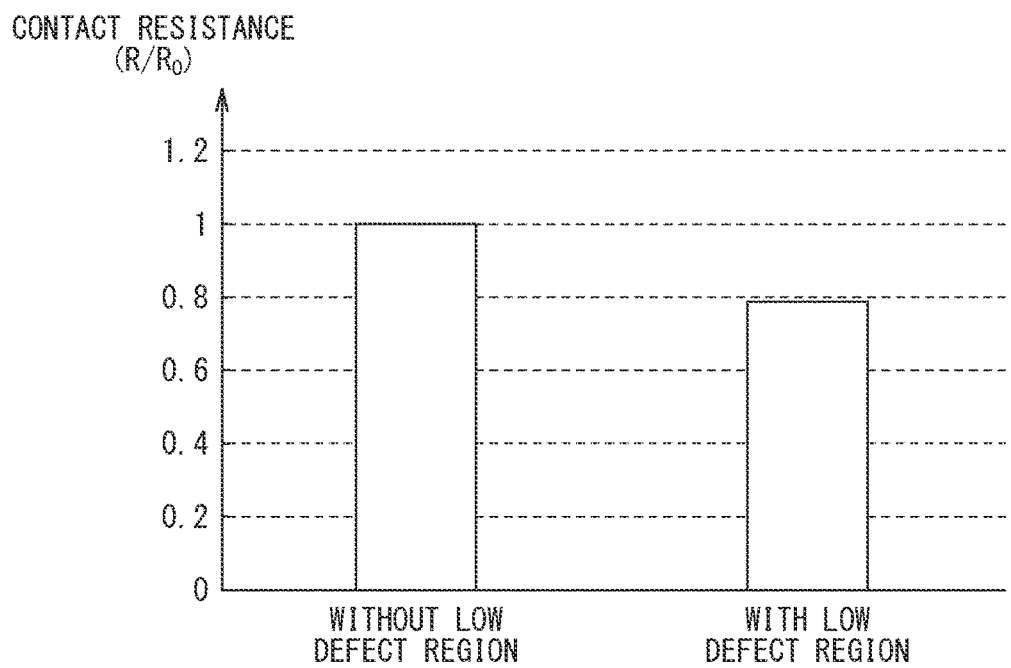
[FIG. 7A]
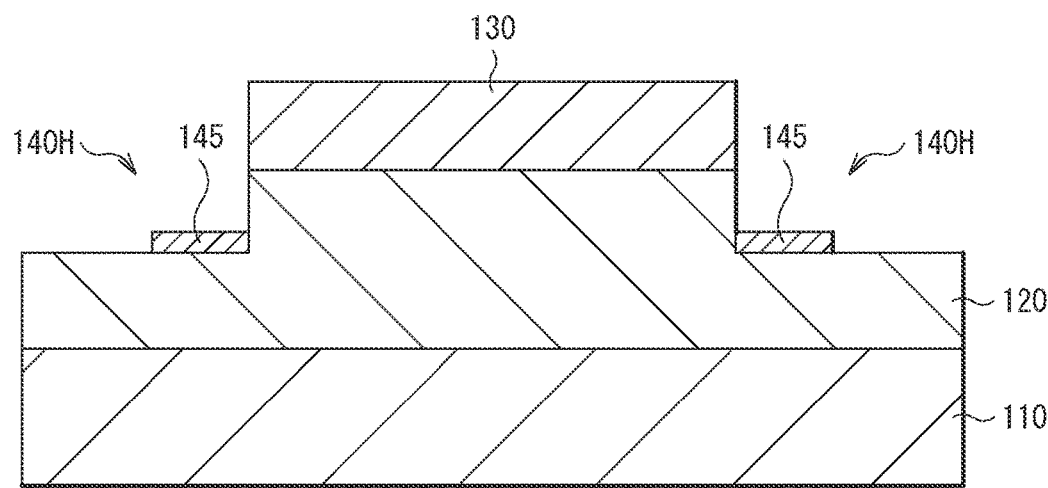

[FIG. 7B]
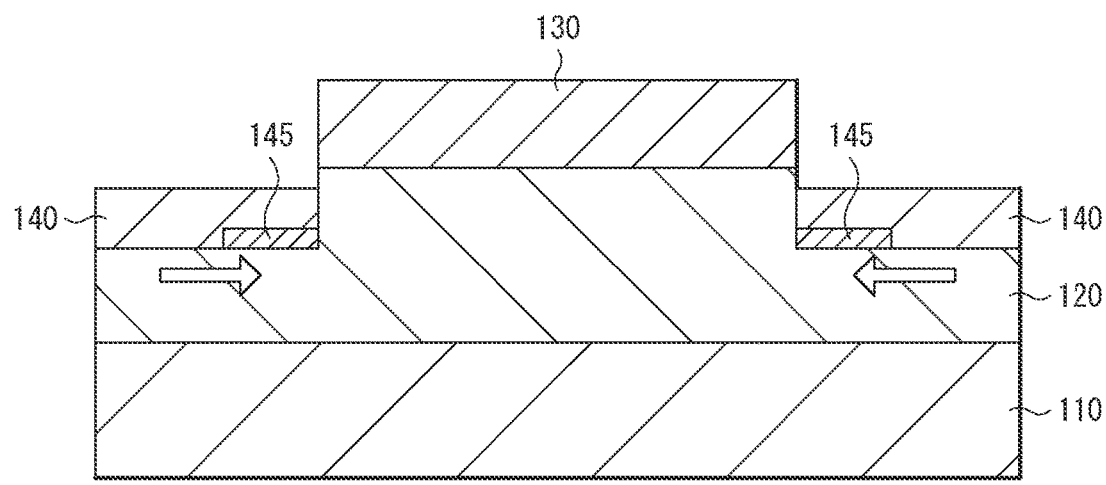
[FIG. 7C]
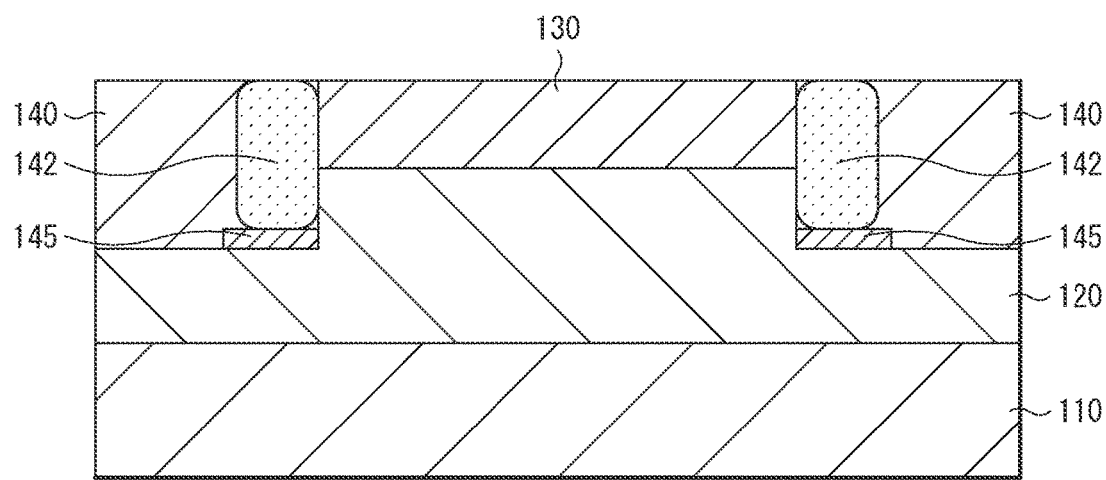

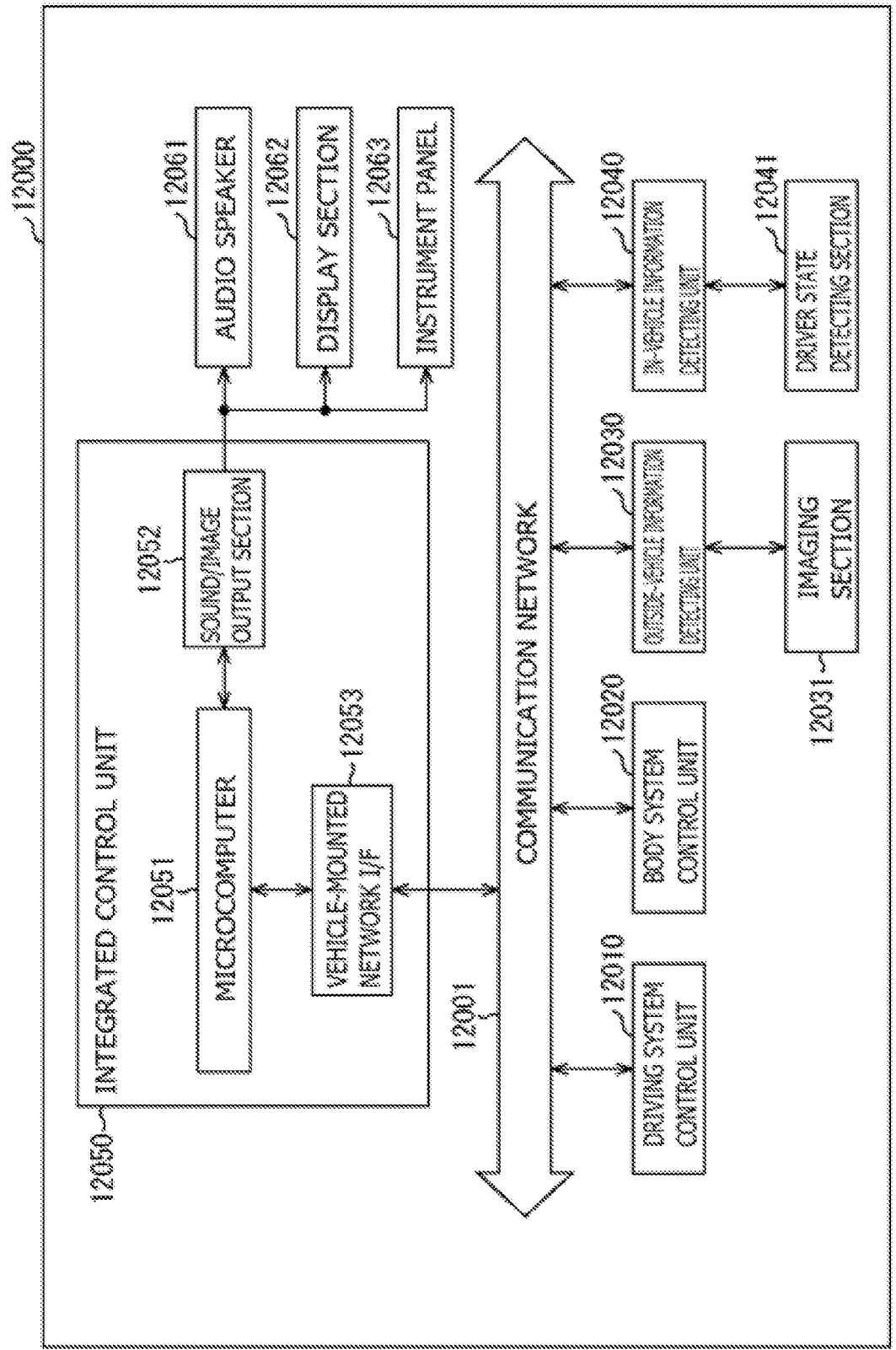
[FIG. 8]

[FIG. 9]
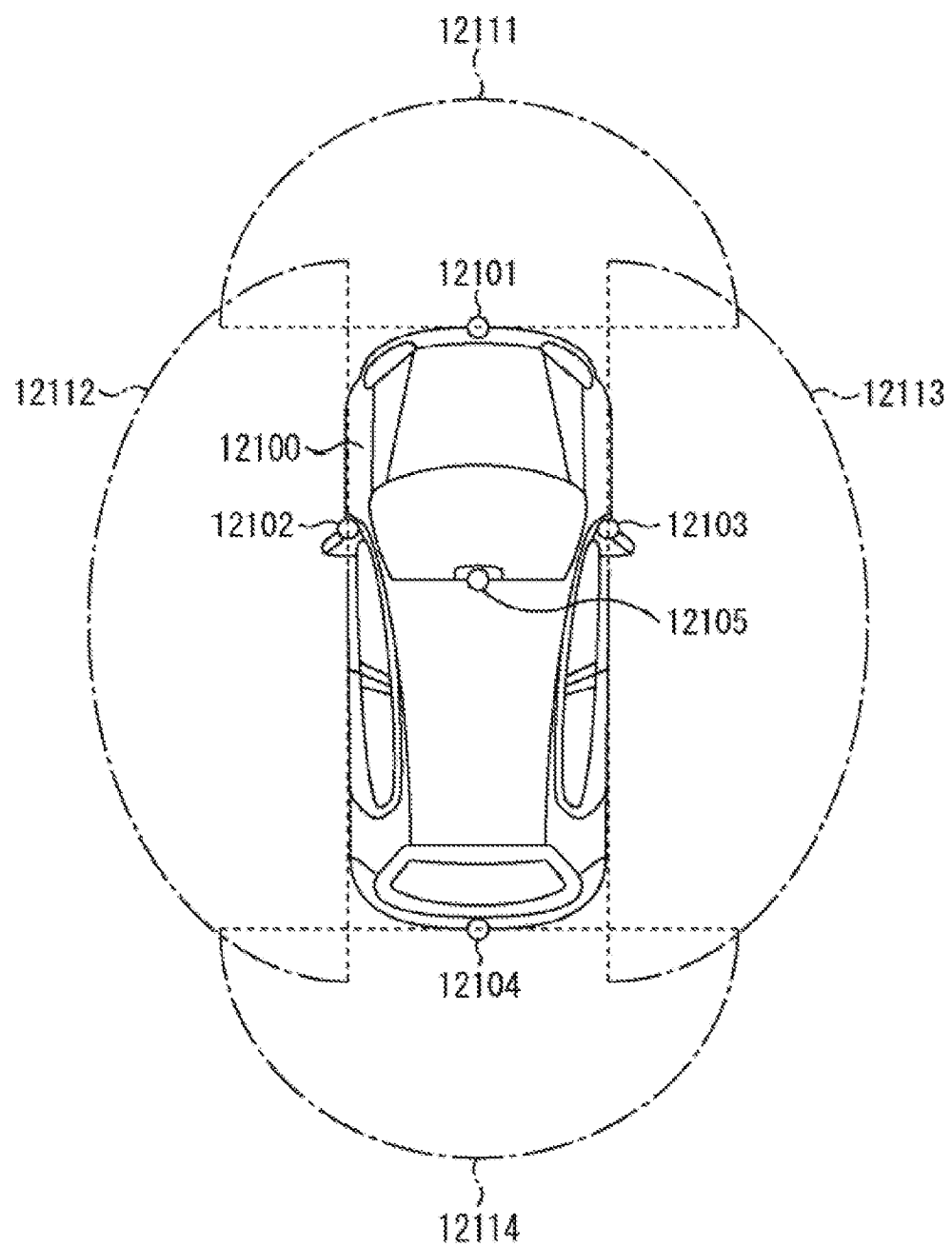

SEMICONDUCTOR DEVICE

CROSS REFERENCE TO RELATED APPLICATIONS

This application is a U.S. National Phase of International Patent Application No. PCT/JP2021/015666 filed on Apr. 16, 2021, which claims priority benefit of Japanese Patent Application No. JP 2020-095054 filed in the Japan Patent Office on May 29, 2020. Each of the above-referenced applications is hereby incorporated herein by reference in its entirety.

TECHNICAL FIELD

The present disclosure relates to a semiconductor device.

BACKGROUND ART

Recently, a high electron mobility transistor (High Electron Mobility Transistor: HEMT) using a nitride semiconductor has been put into practical use in applications such as power amplifiers (for example, PTL 1). The high electron mobility transistor is a field-effect transistor in which a two-dimensional electron gas layer formed at an interface of a heterojunction of the nitride semiconductor is used as a channel.

CITATION LIST

Patent Literature

PTL 1: Japanese Unexamined Patent Application Publication No. 2019-192698

SUMMARY OF THE INVENTION

However, because a nitride semiconductor used in a high electron mobility transistor is a wide-band-gap semiconductor, it is difficult to form a low-resistance ohmic contact with an electrode. Accordingly, regarding the high electron mobility transistor, it is desired to decrease resistance between a channel formed at an interface of a heterojunction of the nitride semiconductor and the electrode.

It is therefore desirable to provide a semiconductor device in which resistance between an electrode and a channel is further decreased.

A semiconductor device according to an embodiment of the present disclosure includes a barrier layer, a channel layer, a regrowth layer, a vacancy generation region, and a source electrode or a drain electrode. The barrier layer includes a first nitride semiconductor. The channel layer includes a second nitride semiconductor and is bonded to the barrier layer at a first surface. The regrowth layer includes an n-type nitride semiconductor and is provided in a region dug deeper than an interface between the barrier layer and the channel layer from a second surface of the barrier layer. The second surface is on opposite side to the first surface. The vacancy generation region includes a nitrogen-capturing element and is provided in a region of the regrowth layer shallower than the interface between the barrier layer and the channel layer. The source electrode or the drain electrode is provided on the regrowth layer.

In the semiconductor device according to the embodiment of the present disclosure, the vacancy generation region including the nitrogen-capturing element is provided in the region of the regrowth layer shallower than the interface between the channel layer and the barrier layer. The barrier layer and the channel layer are partially dug to form the regrowth layer. As a result, for example, the vacancy generation region is able to form a vacancy serving as a doner in the regrowth layer below.

BRIEF DESCRIPTION OF DRAWINGS

FIG. 1 is a vertical sectional view of a configuration of a semiconductor device according to a first embodiment of the present disclosure.

FIG. 2 is a schematic energy band diagram illustrating workings and effects of the semiconductor device according to the embodiment.

FIG. 3 is a graph illustrating a relationship between a depth at which a source electrode or a drain electrode is formed from a surface of a barrier layer as a base (zero point) and contact resistance of the source electrode or the drain electrode.

FIG. 4A is a vertical sectional view of a process of a method of manufacturing the semiconductor device according to the embodiment.

FIG. 4B is a vertical sectional view of a process of the method of manufacturing the semiconductor device according to the embodiment.

FIG. 4C is a vertical sectional view of a process of the method of manufacturing the semiconductor device according to the embodiment.

FIG. 4D is a vertical sectional view of a process of the method of manufacturing the semiconductor device according to the embodiment.

FIG. 4E is a vertical sectional view of a process of the method of manufacturing the semiconductor device according to the embodiment.

FIG. 4F is a vertical sectional view of a process of the method of manufacturing the semiconductor device according to the embodiment.

FIG. 5 is a vertical sectional view of a configuration of a semiconductor device according to a second embodiment of the present disclosure.

FIG. 6 is a graph illustrating variation in contact resistance due to presence or absence of a low defect region.

FIG. 7A is a vertical sectional view of a process of a method of manufacturing the semiconductor device according to the embodiment.

FIG. 7B is a vertical sectional view of a process of the method of manufacturing the semiconductor device according to the embodiment.

FIG. 7C is a vertical sectional view of a process of the method of manufacturing the semiconductor device according to the embodiment.

FIG. 8 is a block diagram depicting an example of schematic configuration of a vehicle control system.

FIG. 9 is a diagram of assistance in explaining an example of installation positions of an outside-vehicle information detecting section and an imaging section.

MODES FOR CARRYING OUT THE INVENTION

Some embodiments of the present disclosure are described below in detail with reference to the drawings. The embodiments described below are specific examples of the present disclosure, and the technique according to the present disclosure is not limited to the following embodiments. In addition, arrangements, dimensions, dimension ratios, etc. of respective components of the present disclosure are not limited to the embodiments illustrated in respective drawings.

It is to be noted that the description is given in the following order.

1. First Embodiment
   1.1. Configuration
   1.2. Manufacturing Method
2. Second Embodiment
   2.1. Configuration
   2.2. Manufacturing Method
3. Application Examples

1. First Embodiment

First, referring to FIG. 1, described is a configuration of a semiconductor device according to a first embodiment of the present disclosure. FIG. 1 is a vertical sectional view of a configuration of a semiconductor device 100 according to the present embodiment.

As illustrated in FIG. 1, the semiconductor device 100 includes a substrate 110, a channel layer 120, a barrier layer 130, a regrowth layer 140 including a vacancy generation region 141, a source electrode 150S, a drain electrode 150D, an insulation layer 160, and a gate electrode 170.

The semiconductor device 100 is a high electron mobility transistor that uses, as a channel, a two-dimensional electron gas layer (2DEG) formed by a difference between the magnitude of polarization of the channel layer 120 and the magnitude of polarization of the barrier layer 130. The two-dimensional electron gas layer is formed, for example, in the vicinity of the barrier layer 130 in the channel layer 120.

The substrate 110 is a support body for epitaxially growing the channel layer 120 and the barrier layer 130. Specifically, the substrate 110 may be a substrate including a semiconductor material having a lattice constant close to that of a nitride semiconductor included in the channel layer 120. For example, the substrate 110 may be a substrate including a III-V compound semiconductor such as a single-crystal GaN substrate.

It is to be noted that the semiconductor device 100 may further include a buffer layer between the substrate 110 and the channel layer 120. The buffer layer includes a semiconductor material having a lattice constant close to that of the channel layer 120. The buffer layer is able to make more favorable a crystalline state of the channel layer 120 and to suppress warpage of the substrate 110 by controlling a lattice constant of a surface on which the channel layer 120 is epitaxially grown.

In addition, in a case where the buffer layer is provided, the substrate 110 may be a substrate including a material having a lattice constant different from that of the nitride semiconductor included in the channel layer 120. Specifically, the substrate 110 may be, for example, a SiC substrate, a sapphire substrate, a Si substrate, or the like. For example, in a case where the substrate 110 is a single-crystal Si substrate, providing a buffer layer including AlN, AlGaN, or GaN between the substrate 110 and the channel layer 120 makes it possible to epitaxially grow the channel layer 120 including GaN with a more favorable crystalline state in the semiconductor device 100.

The channel layer 120 includes a nitride semiconductor having a band gap narrower than that of the barrier layer 130. The channel layer 120 is able to accumulate carriers on the channel layer 120 side in the vicinity of the interface between it and the barrier layer 130 due to the difference in the magnitude of polarization between it and the barrier layer 130. For example, the channel layer 120 may include epitaxially grown GaN. Alternatively, the channel layer 120 may include undoped u-GaN with no impurity added. In such a case, the channel layer 120 is able to suppress impurity scattering of carriers, and is therefore able to further increase mobility of the carriers.

The barrier layer 130 includes a nitride semiconductor having a band gap wider than that of the channel layer 120. By being bonded to the channel layer 120, the barrier layer 130 is able to allow the carriers to be accumulated in the channel layer 120 in the vicinity of the barrier layer 130 by spontaneous polarization or piezoelectric polarization. Thus, the two-dimensional electron gas layer having high mobility and high carrier concentration is formed in the vicinity of the barrier layer 130 in the channel layer 120.

For example, the barrier layer 130 may include epitaxially grown $Al_{1-x-y}Ga_xIn_yN$ (where $0 \leq x < 1$ and $0 \leq y < 1$). Alternatively, the barrier layer 130 may include undoped u-$Al_{1-x-y}Ga_xIn_yN$ with no impurity added.

It is to be noted that the barrier layer 130 may include a single layer, or may be provided by stacking a plurality of layers of $Al_{1-x-y}Ga_xIn_yN$ different in composition. In addition, the barrier layer 130 may be configured in such a manner that its composition gradually changes in a thickness direction.

It is to be noted that, although not illustrated, an active region and an element separation region are each provided in an in-plane direction of the substrate 110 for a stack structure including the substrate 110, the channel layer 120, and the barrier layer 130.

The active region is a region in which each configuration of the semiconductor device 100 is provided, and is formed as an island-shaped region surrounded by the element separation region. The element separation region is formed by inactivating the channel layer 120 and the barrier layer 130 by ion implantation using B (boron) or the like. The element separation region is provided to surround the active region and is able to electrically isolate active regions from each other. It is to be noted that the element separation region may be formed by removing the channel layer 120 and the barrier layer 130 by means of etching.

The insulation layer 160 includes an insulating material and is provided on the barrier layer 130. For example, the insulation layer 160 may be provided as, for example, a single-layer film of $SiO_2$, SiN, SiON, $Al_2O_3$, or $HfO_2$ having an insulating property with respect to the barrier layer 130, or a multilayer stacked film thereof. The insulation layer 160 protects a surface of the barrier layer 130 from impurities such as ions and makes favorable an interface between it and the barrier layer 130, to thereby suppress a decrease in properties of the semiconductor device 100.

The gate electrode 170 includes an electrically conductive material and is provided on the insulation layer 160. For example, the gate electrode 170 may be provided by stacking Ni (nickel) and Au (gold) from the insulation layer 160 side.

The gate electrode 170 is able to control the carrier concentration of the two-dimensional electron gas layer formed in the channel layer 120 by means of an applied voltage. Specifically, the gate electrode 170 is able to control the carrier concentration of the two-dimensional electron gas layer formed in the channel layer 120 by means of a field effect by controlling the thickness of a depletion layer formed in the barrier layer 130 below by means of the applied voltage.

The regrowth layer 140 is provided, for example, by performing digging from the barrier layer 130 side to a region deeper than the interface between the barrier layer 130 and the channel layer 120, and filling the dug region with an n-type nitride semiconductor. Specifically, the regrowth layer 140 is provided by partially removing the barrier layer 130 and the channel layer 120 by means of etching or the like to form an opening, and thereafter selectively epitaxially growing a nitride semiconductor including an n-type impurity in the opening. The regrowth layer 140 including the n-type impurity has electrical conductivity higher than that of the barrier layer 130. Therefore, it is possible to electrically couple the source electrode 150S and the drain electrode 150D, and the two-dimensional electron gas layer with low resistance. For example, the regrowth layer 140 may include $In_{1-x}Ga_xN$ including an n-type impurity such as Si or Ge at $1.0 \times 10^{18}/cm^3$ or more.

The source electrode 150S and the drain electrode 150D are provided on the respective regrowth layers 140 provided on both sides of the gate electrode 170. The source electrode 150S and the drain electrode 150D are each able to be electrically coupled to the two-dimensional electron gas layer in the channel layer 120 via the regrowth layer 140. The source electrode 150S and the drain electrode 150D may be provided with a structure in which Ti (titanium), Al (aluminum), Ni (nickel), and Au (gold) are stacked sequentially from the regrowth layer 140 side.

In the semiconductor device 100 according to the present embodiment, the regrowth layer 140 further includes a vacancy generation region 141 including a nitrogen-capturing element. The vacancy generation region 141 is provided in a region, of the regrowth layer 140, that is on a side in contact with the source electrode 150S and the drain electrode 150D and that is shallower than the interface between the barrier layer 130 and the channel layer 120.

In the vacancy generation region 141, the contained nitrogen-capturing element is bonded to nitrogen of the n-type nitride semiconductor, making it possible to generate a nitrogen vacancy in the regrowth layer 140. Specifically, the vacancy generation region 141 is able to extract nitrogen from the regrowth layer 140 below the vacancy generation region 141 by the nitrogen-capturing element, therefore being able to generate a nitrogen vacancy serving as a donor in the regrowth layer 140 below the vacancy generation region 141. Thus, the vacancy generation region 141 is able to improve electrical conductivity of the regrowth layer 140 below the vacancy generation region 141. Accordingly, it is possible to further decrease the contact resistance from the two-dimensional electron gas layer to the source electrode 150S or the drain electrode 150D.

Referring to FIG. 2, workings and effects of the vacancy generation region 141 are described more specifically. FIG. 2 is a schematic energy band diagram illustrating the workings and effects of the semiconductor device 100 according to the present embodiment. It is to be noted that, in FIG. 2, $E_c$ represents an energy level of a lower end of a conduction band, $E_v$ represents an energy level of an upper end of a valence band, and $E_f$ represents a Fermi level.

As illustrated in FIG. 2, at the interface between the vacancy generation region 141 and the regrowth layer 140, nitrogen atoms $N_N$ are extracted from the regrowth layer 140 by the nitrogen-capturing element included in the vacancy generation region 141, and the nitrogen vacancies $V_N$ are thereby generated in the regrowth layer 140. The generated nitrogen vacancies $V_N$ serve as donors and decrease the energy level of the regrowth layer 140, thereby making it possible to lower an energy barrier between the two-dimensional electron gas layer (2DEG) formed at the interface between the channel layer 120 and the barrier layer 130, and the regrowth layer 140. As a result, due to a tunnel effect, contact resistance $R_2$ between the source electrode 150S or the drain electrode 150D and the regrowth layer 140 is decreased, and contact resistance $R_1$ between the regrowth layer 140 and the two-dimensional electron gas layer serving as a channel is also decreased. Accordingly, the regrowth layer 140 is able to form a low-resistance contact from the source electrode 150S or the drain electrode 150D to the two-dimensional atomic gas layer serving as a channel.

The nitrogen-capturing element contained in the vacancy generation region 141 is, for example, Ti (titanium) or Al (aluminum). Ti and Al are able to form a nitride by being bonded to N (nitrogen), and are therefore able to extract N from a region adjacent to the vacancy generation region 141 of the regrowth layer 140. Further, in the semiconductor device 100, configuring the source electrode 150S or the drain electrode 150D to include Ti or Al makes it possible to diffuse Ti or Al from the source electrode 150S or the drain electrode 150D into the regrowth layer 140 to form the vacancy generation region 141. In such a case, it is possible to form the vacancy generation region 141 in the regrowth layer 140 in the semiconductor device 100 without performing any additional process.

It is to be noted that, as described above, the vacancy generation region 141 may be formed by diffusing the nitrogen-capturing element (e.g., Ti, Al, or the like) from the source electrode 150S or the drain electrode 150D into the regrowth layer 140; however, the vacancy generation region 141 may be formed by any other method. For example, the vacancy generation region 141 may be formed by implanting the nitrogen-capturing element (e.g., Ti, Al, or the like) into the regrowth layer 140 by ion implantation or the like.

Now, referring to FIG. 3, described is the depth at which the vacancy generation region 141 is formed. FIG. 3 is a graph illustrating a relationship between a depth at which the source electrode 150S or the drain electrode 150D is formed from the surface of the barrier layer 130 as a base (a zero point) and contact resistance of the source electrode 150S or the drain electrode 150D. It is to be noted that the vacancy generation region 141 is formed immediately below the source electrode 150S or the drain electrode 150D by diffusing Ti from the source electrode 150S or the drain electrode 150D.

FIG. 3 illustrates a measurement result of the semiconductor device 100 in which the thickness of the barrier layer 130 is 10 nm. Further, FIG. 3 describes contact resistance by a relative value where that in a case where the depth at which the source electrode 150S or the drain electrode 150D is formed is 0 nm (that is, a case where the source electrode 150S or the drain electrode 150D is formed at the same surface height as the surface of the barrier layer 130) is regarded as 1.

As illustrated in FIG. 3, in a case where the depth at which the source electrode 150S or the drain electrode 150D is formed is 5 nm, the contact resistance of the source electrode 150S or the drain electrode 150D is remarkably decreased. Because the thickness of the barrier layer 130 is 10 nm, in this case, the vacancy generation region 141 is formed in a region shallower than the interface between the barrier layer 130 and the channel layer 120.

In contrast, in a case where the depth at which the source electrode 150S or the drain electrode 150D is formed is 25 nm, the contact resistance of the source electrode 150S or the drain electrode 150D is increased. Because the thickness of the barrier layer 130 is 10 nm, in this case, the vacancy generation region layer 141 is formed in a region deeper than the interface between the barrier layer 130 and the channel layer 120.

This is because the vacancy generation region 141 forms a vacancy which serves as a donor in the regrowth layer 140 below. By being provided in a region shallower than the interface between the barrier layer 130 and the channel layer 120, the vacancy generation region 141 is able to form a vacancy serving as a doner in a region in contact with the interface between the channel layer 120 and the barrier layer 130 (i.e., the two-dimensional electron gas layer).

According to the semiconductor device 100 of the first embodiment, the vacancy generation region 141 is provided, which makes it possible to form a vacancy serving as a donor in the regrowth layer 140. Therefore, the semiconductor device 100 is able to further enhance the electrical conductivity of the regrowth layer 140. Accordingly, it is possible to decrease the resistance from the two-dimensional electron gas layer to the source electrode 150S or the drain electrode 150D.

(1.2. Manufacturing Method)

Referring to FIGS. 4A, 4B, 4C, 4D, 4E, and 4F, described is an example of a method of manufacturing the semiconductor device 100 according to the present embodiment. FIGS. 4A, 4B, 4C, 4D, 4E, and 4F are each a vertical sectional view illustrating each process of the method of manufacturing the semiconductor device 100 according to the present embodiment.

First, as illustrated in FIG. 4A, for example, GaN is epitaxially grown on the substrate 110 including GaN or the like to thereby form the channel layer 120. Thereafter, AlGaN ($Al_{0.3}$—$Ga_{0.7}N$ mixed crystal) is epitaxially grown on the channel layer 120 to thereby form the barrier layer 130.

Thereafter, although not illustrated, B (boron) is ion-implanted into a predetermined planar region of the barrier layer 130 and the channel layer 120 to thereby form an element separation region in which the resistance of the barrier layer 130 and the channel layer 120 is increased. For example, the element separation region is so formed as to surround the periphery of the island-shaped active region, and electrically isolates active regions from each other. It is to be noted that the element separation region may be formed at any timing such as a timing after the formation of the source electrode 150S and the drain electrode 150D, or a timing after the formation of the gate electrode 170, which will be described later.

Thereafter, as illustrated in FIG. 4B, the barrier layer 130 and the channel layer 120 are partially removed by etching to form an opening 140H for selectively growing the regrowth layer 140 in a later process. A region to form the opening 140H corresponds to a region to form the source electrode 150S and the drain electrode 150D in a later process.

Thereafter, as illustrated in FIG. 4C, InGaN including an n-type impurity such as Si or Ge is selectively epitaxially grown to fill the opening 140H, to thereby form the regrowth layer 140.

Thereafter, as illustrated in FIG. 4D, the source electrode 150S and the drain electrode 150D are formed on the regrowth layer 140. Specifically, Ti (titanium), Al (aluminum), Ni (nickel), and Au (gold) are sequentially deposited on the regrowth layer 140 and thereafter patterned to thereby form the source electrode 150S and the drain electrode 150D.

Accordingly, as illustrated in FIG. 4E, Ti (titanium) is diffused from the source electrode 150S and the drain electrode 150D into the regrowth layer 140. As a result, the vacancy generation region 141 is formed in the regrowth layer 140. The vacancy generation region 141 is formed in a region into which Ti is diffusible from the source electrode 150S and the drain electrode 150D. Therefore, the vacancy generation region 141 is provided in a region shallower than the interface between the channel layer 120 and the barrier layer 130.

Thereafter, as illustrated in FIG. 4F, the insulation layer 160 and the gate electrode 170 are formed on the barrier layer 130.

Specifically, first, a film of $SiO_2$ (silicon dioxide) or the like is formed on the barrier layer 130 by a CVD (Chemical Vapor Deposition) method except for a region provided with the source electrode 150S and the drain electrode 150D, to thereby form the insulation layer 160. It is to be noted that the insulation layer 160 may be provided by forming a film of $Al_2O_3$ (aluminum oxide) by an ALD (Atomic Layer Deposition) method, or may be provided by forming a film of SiN (silicon nitride) by a CVD method. Alternatively, the insulation layer 160 may be provided by stacking a plurality of layers including the above-described materials.

Thereafter, the gate electrode 170 is formed on the insulation layer 160 between the source electrode 150S and the drain electrode 150D. Specifically, Ni (nickel) and Au (gold) are sequentially deposited on the insulation layer 160 and thereafter patterned to thereby form the gate electrode 170.

By the above-described processes, it is possible to form the semiconductor device 100 according to the present embodiment.

2. Second Embodiment (2.1. Configuration)

Next, referring to FIG. 5, described is a configuration of a semiconductor device according to a second embodiment of the present disclosure. FIG. 5 is a vertical sectional view of a configuration of a semiconductor device 101 according to the present embodiment.

As illustrated in FIG. 5, as compared with the semiconductor device 100 according to the first embodiment, the semiconductor device 101 according to the second embodiment is different in that a low defect region 142 is further provided in a region, of the regrowth layer 140, in contact with the interface between the channel layer 120 and the barrier layer 130.

The low defect region 142 is a region having a crystal defect density lower than that in other regions of the regrowth layer 140. The low defect region 142 is provided in a region, of the regrowth layer 140, in contact with the interface between the channel layer 120 and the barrier layer 130, extending toward the channel layer 120 side.

The low defect region 142 is able to facilitate injection of carriers from the source electrode 150S to the two-dimensional electron gas layer (2DEG) formed at the interface between the channel layer 120 and the barrier layer 130, and also facilitate discharging of carriers from the two-dimensional electron gas layer to the drain electrode 150D.

For example, in a case where the crystal defect density is $1.0 \times 10^8/cm^2$, the size of a region in which carriers injected from the two-dimensional electron gas layer serving as a channel are movable without being influenced by a crystal defect is about 1 µm square. In addition, the size of the region in which the carriers are movable without being influenced by a crystal defect decreases as the crystal defect density increases. In a case where the crystal defect density is $1.0 \times 10^9/cm^2$, the size of the region is about 300 nm square. In a case where the crystal defect density is $1.0 \times 10^{10}/cm^2$, the size of the region is about 100 nm square. In a case where the crystal defect density is $1.0 \times 10^{11}/cm^2$, the size of the region is less than 30 nm square.

In GaN which is a typical nitride semiconductor, a mean free path of carriers having energy of 1 eV is about 14 nm. Therefore, it is conceivable that if the crystal defect density in the low defect region 142 is $1.0 \times 10^{10}/cm^2$ or less, carriers injected from the channel to the low defect region 142 are able to move without being influenced by a crystal defect with high probability. Accordingly, providing the low defect region 142 in a region in contact with the interface between the channel layer 120 and the barrier layer 130 makes it possible for the regrowth layer 140 to further decrease the contact resistance from the channel to the source electrode 150S or the drain electrode 150D.

It is possible to calculate the crystal defect density of the low defect region 142, for example, from an image captured by TEM (Transmission Electron Microscope). In the image captured by TEM, the crystal defect is observed as a change in brightness in the captured image. Therefore, it is possible to calculate the crystal defect density from the image captured by TEM.

Here, referring to FIG. 6, described is a decrease in the contact resistance due to the low defect region 142. FIG. 6 is a graph illustrating variation in the contact resistance due to presence or absence of the low defect region 142.

FIG. 6 illustrates variation in the contact resistance due to the presence or the absence of the low defect region 142 having the crystal defect density of $1.0 \times 10^{10}/cm^2$ or less. It is to be noted that FIG. 6 describes the contact resistance by a relative value where that in a case where no low defect region 142 is provided is regarded as 1.

As illustrated in FIG. 6, it can be appreciated that, as compared with the case where no low defect region 142 is provided, in a case where the low defect region 142 is provided, the contact resistance decreases by about 20% in the semiconductor device 101.

According to the semiconductor device 101 of the second embodiment, the low defect region 142 is provided in a region in contact with the interface between the channel layer 120 and the barrier layer 130, which makes it possible to further facilitate the injection of the carriers from the regrowth layer 140 to the two-dimensional electron gas layer and the discharging of the carriers from the two-dimensional electron gas layer to the regrowth layer 140. Accordingly, it is possible to further decrease the resistance between the two-dimensional electron gas layer and the source electrode 150S or the drain electrode 150D in the semiconductor device 101.

(2.2. Manufacturing Method)

Referring to FIGS. 7A, 7B and 7C, described is a method of manufacturing the semiconductor device 101 according to the present embodiment. FIGS. 7A, 7B, and 7C are each a vertical sectional view of each process of the method of manufacturing the semiconductor device 101 according to the present embodiment.

First, through processes similar to the processes illustrated in FIGS. 4A and 4B, a stack structure including the substrate 110, the channel layer 120, and the barrier layer 130 is formed, and the opening 140H for forming the regrowth layer 140 is formed in the stack structure.

Thereafter, as illustrated in FIG. 7A, an underlayer 145 is provided on a bottom surface in a region, of the opening 140H, in contact with the interface between the channel layer 120 and the barrier layer 130. For example, the underlayer 145 includes SiN and is provided to mask the channel layer 120 in the region in contact with the interface between the channel layer 120 and the barrier layer 130.

Thereafter, as illustrated in FIG. 7B, the regrowth layer 140 is selectively epitaxially grown in the opening 140H with the underlayer 145 being provided. At this time, because the regrowth layer 140 is unable to be epitaxially grown from the channel layer 120 on the underlayer 145, crystal growth occurs laterally in an in-plane direction of the bottom surface of the opening 140H, and the regrowth layer 140 is thus formed on the underlayer 145. This allows the regrowth layer 140, which is provided on the underlayer 145, to be formed without taking over a crystal defect present in the channel layer 120. Therefore, the regrowth layer 140 provided on the underlayer 145 is provided to have a crystal defect density lower than that in other regions of the regrowth layer 140.

Thus, as illustrated in FIG. 7C, the regrowth layer 140 in the region on the underlayer 145 is provided with a lower crystal defect density without taking over the crystal defect present in the channel layer 120. Accordingly, the regrowth layer 140 in the region on the underlayer 145 is provided as the low defect region 142.

By the above-described processes, it is possible to form the regrowth layer 140 including the low defect region 142. After the regrowth layer 140 is formed, the source electrode 150S and the drain electrode 150D are formed on the regrowth layer 140, and the insulation layer 160 and the gate electrode 170 are formed on the barrier layer 130 by processes similar to those illustrated in FIGS. 4D, 4E, and 4F.

3. Application Examples

The technique according to the present disclosure described above is able to be favorably used in amplification of a high-frequency signal. Specifically, the semiconductor devices 100 and 101 according to the first and second embodiments of the present disclosure are able to be favorably used in an amplification circuit for a high-frequency signal of a vehicle-mounted ranging sensor using a millimeter wave.

For example, the technique according to the present disclosure may be applied to a ranging sensor to be provided on any kind of mobile bodies, including automobiles, electric vehicles, hybrid electric vehicles, motorcycles, bicycles, personal mobilities, aircrafts, drones, vessels, robots, and the like. Specifically described below is an example of a control system for a mobile body to which the technique according to the present disclosure is applicable.

FIG. 8 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 8, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 8, an audio speaker 12061, a display section 12062, and an instrument panel 12063 are illustrated as the output device. The display section 12062 may, for example, include at least one of an on-board display and a head-up display.

FIG. 9 is a diagram depicting an example of the installation position of the imaging section 12031.

In FIG. 9, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 9 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

A description has been given above of an example of the vehicle control system to which the technique according to the present disclosure is applicable. The technique according to the present disclosure is applicable to a ranging sensor using a millimeter wave or the like included in the imaging section 12031 or the like among the above-described configurations. Application of the technique according to the present disclosure to an amplification circuit or the like of the ranging sensor makes it possible to decrease on-resistance. It is thus possible to measure a distance to an object with higher sensitivity. Accordingly, the microcomputer 12051 is able to perform more appropriate automated driving or the like.

The technique according to the present disclosure has been described above with reference to the first and second embodiments. However, the technique according to the present disclosure is not limited to the above-described embodiments and the like and various modifications are possible.

For example, the regrowth layer 140 including the vacancy generation region 141 may be provided only on the source electrode 150S, may be provided only on the drain electrode 150D, or may be provided on both the source electrode 150S and the drain electrode 150D.

In addition, the semiconductor devices 100 and 101 may be used in a wireless communication apparatus in a mobile body communication system or the like. Specifically, they may be used in an RF switch, a power amplifier, or the like of a wireless communication apparatus having a communication frequency in a UHF (Ultra High Frequency) band or higher.

Furthermore, not all of the configurations and the operations described in each of the embodiments are essential to the configurations and the operations of the present disclosure. For example, among the components in each of the embodiments, components not described in the independent claims describing the most superordinate concept of the present disclosure should be understood as optional components.

The terms used throughout the specification and the appended claims should be construed as "non-limiting" terms. For example, the terms "include" or "be included" should be construed as "not limited to the example described with the term included". The term "have" should be construed as "not limited to the example described with the term have".

The terms used herein include some terms that are used merely for convenience of description and are not used to limit the configuration and the operation. For example, the term such as "right," "left," "upper," or "lower" merely indicates a direction on the referred drawing. Further, the terms "inner" and "outer" merely indicate a direction toward the center of the component of interest and a direction away from the center of the component of interest, respectively. This similarly applies to terms similar to the above-described terms and terms having similar meanings.

It is to be noted that the technique according to the present disclosure is able to have the following configurations. According to the technique of the present disclosure having the following configurations, a vacancy serving as a doner is formed in the regrowth layer below the vacancy generation region by the vacancy generation region provided in the regrowth layer. This improves the electrical conductivity of the regrowth layer, and therefore further decreases resistance between an electrode and two-dimensional electron gas (i.e., a channel). Effects exerted by the technique according to the present disclosure are not necessarily limited to the effects described here, and may be any of the effects described in the present disclosure.

(1)

A semiconductor device including:
a barrier layer including a first nitride semiconductor;
a channel layer including a second nitride semiconductor and bonded to the barrier layer at a first surface;
a regrowth layer including an n-type nitride semiconductor and provided in a region dug deeper than an interface between the barrier layer and the channel layer from a second surface of the barrier layer, the second surface being on opposite side to the first surface;
a vacancy generation region including a nitrogen-capturing element and provided in a region of the regrowth layer shallower than the interface between the barrier layer and the channel layer; and
a source electrode or a drain electrode provided on the regrowth layer.

(2)

The semiconductor device according to (1) described above, in which the nitrogen-capturing element includes Ti or Al.

(3)

The semiconductor device according to (1) or (2) described above, in which the source electrode or the drain electrode includes the nitrogen-capturing element.

(4)

The semiconductor device according to any one of (1) to (3) described above, in which the vacancy generation region further includes a nitride of the nitrogen-capturing element.

(5)

The semiconductor device according to any one of (1) to (4) described above, in which the regrowth layer further includes a low defect region in a region in contact with the interface between the barrier layer and the channel layer, the low defect region having a crystal defect density lower than that in other regions of the regrowth layer.

(6)

The semiconductor device according to (5) described above, in which the crystal defect density of the low defect region is lower than or equal to $1.0 \times 10^{10}/cm^2$.

(7)

The semiconductor device according to (5) or (6) described above, in which the low defect region is provided to extend from the interface between the barrier layer and the channel layer toward a channel layer side.

(8)

The semiconductor device according to any one of (1) to (7) described above, in which a band gap of the first nitride semiconductor is greater than a band gap of the second nitride semiconductor.

(9)

The semiconductor device according to any one of (1) to (8) described above, in which the second surface of the barrier layer is further provided with a gate electrode with an insulation layer interposed therebetween.

(10)

The semiconductor device according to (9) described above, in which the gate electrode is provided between the source electrode provided on the regrowth layer and the drain electrode provided on the regrowth layer.

This application claims the priority on the basis of Japanese Patent Application No. 2020-095054 filed on May 29, 2020 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor device comprising:
a barrier layer including a first nitride semiconductor;
a channel layer including a second nitride semiconductor and bonded to the barrier layer at a first surface;
a regrowth layer including an n-type nitride semiconductor and provided in a region dug deeper than an interface between the barrier layer and the channel layer from a second surface of the barrier layer, the second surface being on opposite side to the first surface;
a vacancy generation region including a nitrogen-capturing element and provided in a region of the regrowth layer shallower than the interface between the barrier layer and the channel layer; and
a source electrode or a drain electrode provided on the regrowth layer.

2. The semiconductor device according to claim 1, wherein the nitrogen-capturing element includes Ti or Al.

3. The semiconductor device according to claim 1, wherein the source electrode or the drain electrode includes the nitrogen-capturing element.

4. The semiconductor device according to claim 1, wherein the vacancy generation region further includes a nitride of the nitrogen-capturing element.

5. The semiconductor device according to claim 1, wherein the regrowth layer further includes a low defect region in a region in contact with the interface between the barrier layer and the channel layer, the low defect region having a crystal defect density lower than that in other regions of the regrowth layer.

6. The semiconductor device according to claim 5, wherein the crystal defect density of the low defect region is lower than or equal to $1.0 \times 10^{10}/cm^2$.

7. The semiconductor device according to claim 5, wherein the low defect region is provided to extend from the interface between the barrier layer and the channel layer toward a channel layer side.

8. The semiconductor device according to claim 1, wherein a band gap of the first nitride semiconductor is greater than a band gap of the second nitride semiconductor.

9. The semiconductor device according to claim 1, wherein the second surface of the barrier layer is further provided with a gate electrode with an insulation layer interposed therebetween.

10. The semiconductor device according to claim 9, wherein the gate electrode is provided between the source electrode provided on the regrowth layer and the drain electrode provided on the regrowth layer.

* * * * *